US009870973B2

(12) United States Patent
Mitsui (10) Patent No.: US 9,870,973 B2
(45) Date of Patent: Jan. 16, 2018

(54) COOLING DEVICE AND DEVICE

(71) Applicant: NEC Corporation, Minato-ku, Tokyo (JP)

(72) Inventor: Tomoyuki Mitsui, Tokyo (JP)

(73) Assignee: NEC CORPORATION, Tokyo (JP)

( * ) Notice: Subject to any disclaimer, the term of this patent is extended or adjusted under 35 U.S.C. 154(b) by 0 days.

(21) Appl. No.: 15/072,835

(22) Filed: Mar. 17, 2016

(65) Prior Publication Data

US 2016/0284623 A1    Sep. 29, 2016

(30) Foreign Application Priority Data

Mar. 26, 2015 (JP) ................................. 2015-064069

(51) Int. Cl.
*H01L 23/40* (2006.01)
*H05H 7/20* (2006.01)
(Continued)

(52) U.S. Cl.
CPC ...... *H01L 23/3672* (2013.01); *H01L 23/4006* (2013.01); *H05K 7/2039* (2013.01);
(Continued)

(58) Field of Classification Search
CPC ............... H01L 23/4006; H01L 23/427; H01L 23/4093; H01L 24/73; H01L 23/13; H01L 23/367; H01L 23/10; H01L 23/32; H01L 23/3107; H01L 23/3672; H01L 2023/4081; H01L 2023/4056; H01L 23/40; G06F 1/20; G06F 1/183; H05K 1/0203; H05K 7/2039; H05K 7/20445; H05K 7/1069;
(Continued)

(56) References Cited

U.S. PATENT DOCUMENTS 5,910,884 A * 6/1999 Garza ....................... G06F 1/20
165/80.3
6,023,413 A * 2/2000 Umezawa ............. H01L 23/467
165/80.3
(Continued)

FOREIGN PATENT DOCUMENTS

JP    H07-112029 B    11/1995
JP    10-070383 A     3/1998
(Continued)

OTHER PUBLICATIONS

Japanese Office Action for JP Application No. 2015-064069 dated May 17, 2016 with English Translation.

*Primary Examiner* — Adam B Dravininkas (57) ABSTRACT

Heat dissipaters 120*a*, 120*b* are thermally coupled to a memory 220 and a CPU 230 (heat generating components) disposed on a top surface (a first surface) of a substrate 210. A frame 130 is thermally conductive and is attached above the top surface of the substrate 210. Openings 131 are formed in locations corresponding to locations in the frame 130 where the heat dissipaters 120*a*, 120*b* are provided. Elastic rubber elements 150 are thermally conductive and flexible, and thermally couple the heat dissipaters 120*a*, 120*b* to the frame 130. This configuration is capable of dissipating heat generated by the heat generating components even when the heat generating components generate amounts of heat that exceed the heat dissipation ability of the heat dissipaters thermally coupled to the heat generating components.

9 Claims, 7 Drawing Sheets

(51) Int. Cl.
*H01L 23/367* (2006.01)
*H05K 7/20* (2006.01)

(52) U.S. Cl.
CPC ...... *H01L 23/40* (2013.01); *H01L 2023/4056* (2013.01); *H01L 2023/4081* (2013.01)

(58) Field of Classification Search
CPC ............. H05K 7/1007; H05K 7/20154; H05K 7/20963; H05K 1/189
See application file for complete search history.

(56) References Cited

U.S. PATENT DOCUMENTS

| | | | | |
|---|---|---|---|---|
| 7,450,400 | B2* | 11/2008 | Boudreaux | ......... H01L 23/3672 257/E23.084 |
| 2006/0141851 | A1* | 6/2006 | Matsui | ...................... F21K 9/00 439/490 |
| 2006/0185896 | A1* | 8/2006 | Ikeda | ...................... H01L 23/36 174/520 |
| 2008/0273310 | A1* | 11/2008 | Lin | ..................... H01L 23/4006 361/719 |
| 2010/0165627 | A1* | 7/2010 | Wung | ..................... F21S 2/005 362/249.02 |
| 2011/0287638 | A1* | 11/2011 | Beaman | ............. H01L 23/4006 439/65 |
| 2011/0304979 | A1* | 12/2011 | Peterson | ................... G06F 1/20 361/679.47 |
| 2014/0092547 | A1* | 4/2014 | Boyd | .................... H05K 3/301 361/679.32 |
| 2016/0205784 | A1* | 7/2016 | Kyle | ..................... H05K 3/301 361/679.02 |

FOREIGN PATENT DOCUMENTS

| | | |
|---|---|---|
| JP | H11-121666 A | 4/1999 |
| JP | 2002-033422 A | 1/2002 |
| WO | 2014/148026 A1 | 9/2014 |

\* cited by examiner

COOLING DEVICE AND DEVICE

This application is based upon and claims the benefit of priority from Japanese Patent Application No. 2015-064069, filed on Mar. 26, 2015, the disclosure of which is incorporated herein in its entirety by reference.

TECHNICAL FIELD

The present invention relates to a cooling device, and relates, for example, to a cooling device that cools heat generating components mounted on a substrate.

BACKGROUND ART

Patent Literature 1 (Japanese Laid-open Patent Publication No. 2002-33422) describes an invention of a cooling structure including a thermal conducting sheet in which a thermal conducting sheet 16 is provided between a heat generating component (IC (Integrated Circuit) chip 20) mounted on a substrate and a heat dissipater (a heatsink 15) provided over the heat generating component. The thermal conducting sheet 16 is made of a flexible rubber-like elastic material and is thermally conductive. The thermal conducting sheet 16 thermally couples the heat generating component to the heat dissipater.

Note that techniques relating to the present invention are also disclosed in Patent Literature 2 (Japanese Examined Patent Publication No. 7-112029) and Patent Literature 3 (Japanese Laid-open Patent Publication No. 11-121666).

However, the technique described in Patent Literature 1 has a problem that because heat generated by one heat generating component is dissipated by one heat dissipater, the dissipater alone cannot dissipate heat generated by the heat generating component when the heat generating component generates an amount of heat that exceeds the heat dissipation ability of the heat dissipater.

The present invention has been made in light of these circumstances, and an object of the present invention is to provide a cooling device and the like capable of dissipating heat generated by a heat generating component even when, for example, the heat generating component generates an amount of heat that exceeds the heat dissipation ability of a heat dissipater thermally coupled to the heat generating component.

SUMMARY

An object of the present invention is to provide a cooling device and the like capable of dissipating heat generated by a heat generating component even when, for example, the heat generating component generates an amount of heat that exceeds the heat dissipation ability of a heat dissipater thermally coupled to the heat generating component.

A cooling device for at least one heat generating component mounted on a first surface of a substrate includes a heat dissipater thermally coupled to the heat generating component; a frame which is thermally conductive and includes an opening in which the heat dissipater is disposed; and a connecting element which is thermally conductive and flexible and thermally couples the heat dissipater to the frame.

A device includes a substrate having a first surface; a heat generating component mounted on the first surface of the substrate; a heat dissipater thermally coupled to the heat generating component; a frame which is thermally conductive and includes an opening in which the heat dissipater is disposed; and a connecting element which is thermally conductive and flexible and thermally couples the heat dissipater to the frame.

BRIEF DESCRIPTION OF THE DRAWINGS

Exemplary features and advantages of the present invention will become apparent from the following detailed description when taken with the accompanying drawings in which.

EXEMPLARY EMBODIMENTS

Exemplary embodiments of the present invention will now be described in detail in accordance with the accompanying drawings.

First Exemplary Embodiment

Figure 1:
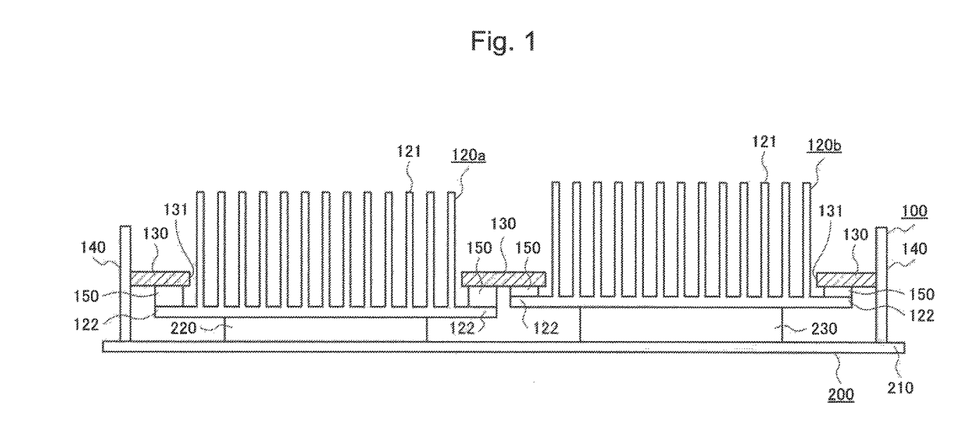
FIG. 1 is a cross-sectional view of a cooling device according to a first exemplary embodiment of the present invention after being attached to an electronic circuit board.
Figure 2:
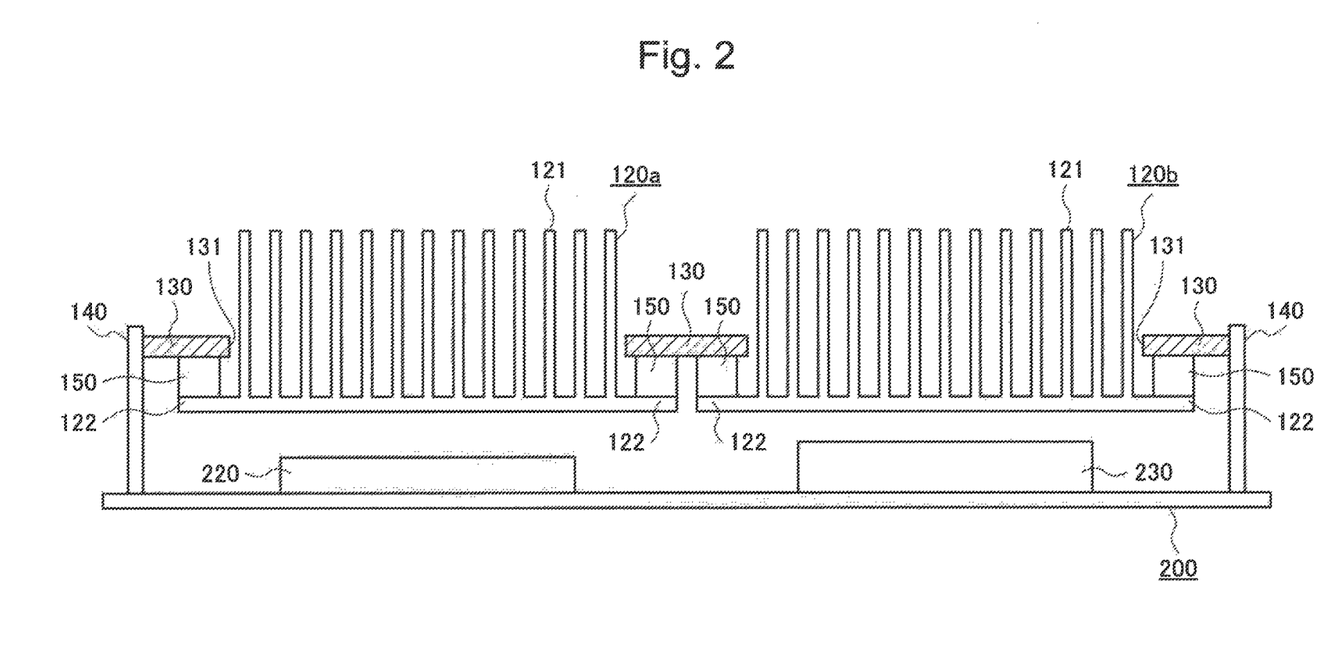
FIG. 2 is a cross sectional view of the cooling device according to the first exemplary embodiment of the present invention before being attached to the electronic circuit board.
Figure 3:
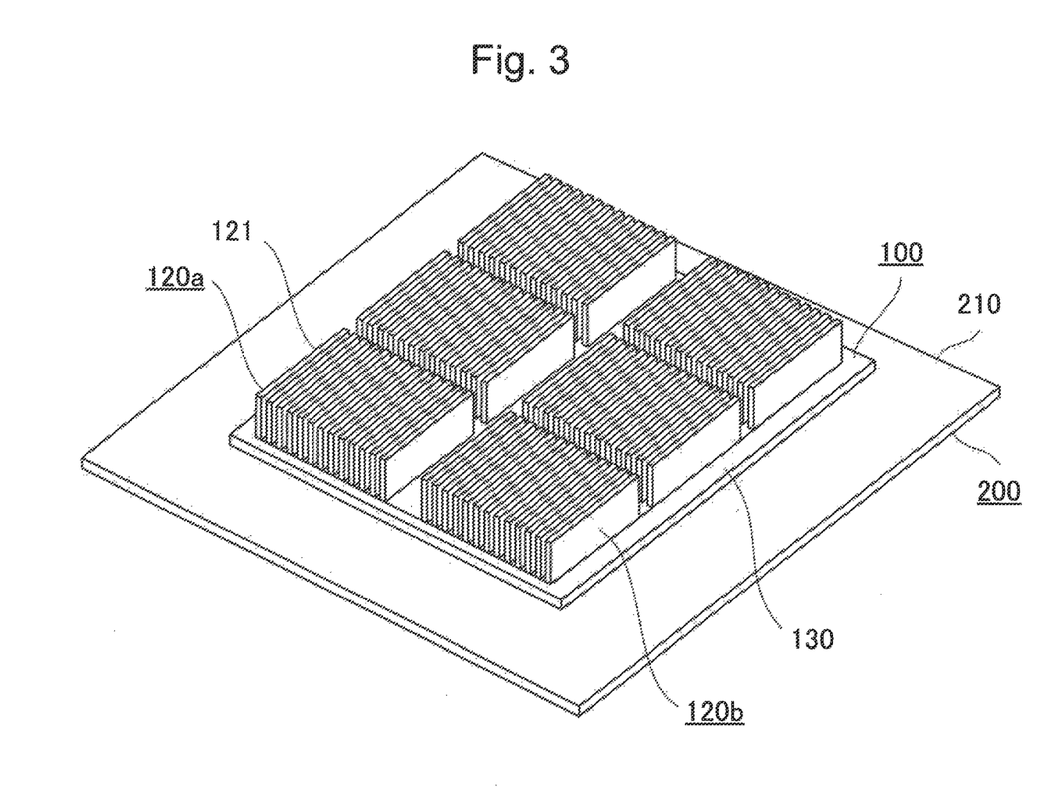
FIG. 3 is a perspective view of the cooling device according to the first exemplary embodiment of the present invention after being attached to the electronic circuit board.
Figure 4:
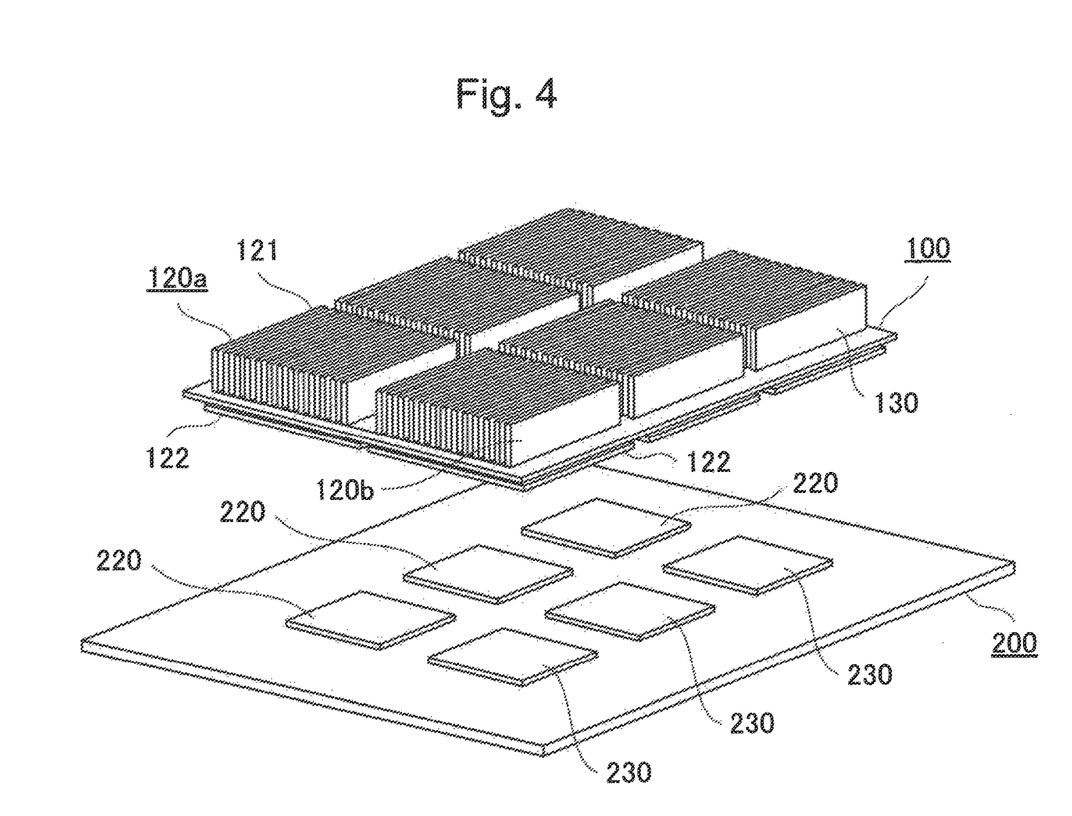
FIG. 4 is a perspective view of the cooling device according to the first exemplary embodiment of the present invention before being attached to the electronic circuit board.
Figure 5:
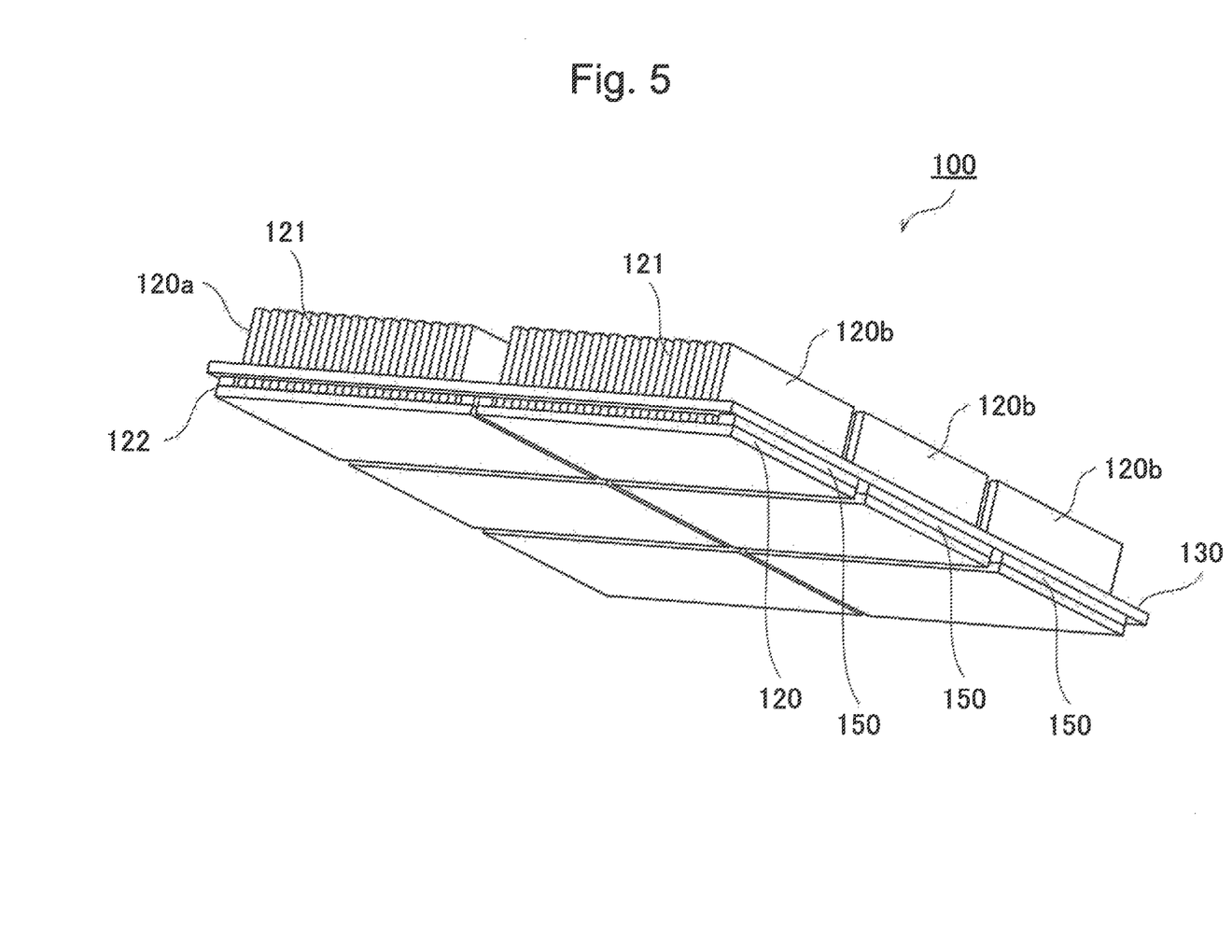
FIG. 5 is a perspective view of the cooling device according to the first exemplary embodiment of the present invention, viewed from the bottom.

A configuration of a cooling device 100 according to a first exemplary embodiment of the present invention will be described. FIG. 1 is a cross-sectional view of the cooling device 100 after being attached to an electronic circuit board 200. FIG. 2 is a cross-sectional view of the cooling device 100 before being attached to the electronic circuit board 200. FIG. 3 is a perspective view of the cooling device 100 after being attached to the electronic circuit board 200. FIG. 4 is a perspective view of the cooling device 100 before being attached to the electronic circuit board 200. FIG. 5 is a perspective view of the cooling device 100 viewed from the bottom.

For convenience of explanation, a configuration of the electronic circuit board 200 will be described first. As illustrated in FIGS. 1, 2 and 4, the electronic circuit board 200 includes a substrate 210, memories 220, and CPUs (Central Processing Units) 230.

The substrate 210 is formed in the shape of a plate. The substrate 210 is made of glass epoxy resin, for example. A frame holding member 140, which will be described later, is attached to the substrate 210.

The memories 220 and the CPUs 230 are mounted on a top surface (the surface on the upper side of FIGS. 1 and 2) of the substrate 210. Note that the top surface of the substrate 210 is a first surface in the present invention. The memories 220 and the CPUs 230 are heat generating components in the present invention. Heat generating components are electronic components that generate heat as the electronic components operate. The memories 220 and the CPUs 230 are thermally coupled to heat dissipaters 120a, 120b, which will be described later.

A configuration of the electronic circuit board 200 has been described so far.

A configuration of the cooling device 100 will be described next.

As illustrated in FIGS. 1 and 2, the cooling device 100 includes heat dissipaters 120a, 120b a frame 130, a frame holding member 140 and elastic rubber elements 150.

As illustrated in FIGS. 1, 2 and 4, the heat dissipaters 120a are provided in such a manner that each heat dissipater 120a faces a memory 220 mounted on the top surface of the substrate 210. Similarly, the heat dissipaters 120b are provided in such a manner that each heat dissipater 120b faces a CPU 230 mounted on the substrate 210. The heat dissipater 120a is thermally coupled to the memory 220. Similarly, the heat dissipater 120b is thermally coupled to the CPU 230.

Note that in the example in FIG. 1, the heat dissipater 120a is directly thermally coupled to the memory 220 rather than via an insert. However, the heat dissipater 120a may be thermally coupled to the memory 220 via a thermal conducing sheet (not depicted), for example. Similarly, the heat dissipater 120b in the example in FIG. 1 is directly thermally coupled to the CPU 230 rather than via an insert. However, the heat dissipater 120b may be thermally coupled to the CPU 230 via a heat conducting sheet (not depicted) or heat dissipating grease (not depicted), for example. Note that the thermal conducting sheet is made of a material such as carbon fibers or silicon. Heat dissipating grease is grease containing particles of a good thermal conductor. The base material of the grease is modified silicon or the like whose viscosity that does not significantly change in a temperature range from room temperature to a certain high temperature. Particles of the good thermal conductor may be particles of a material such as copper, silver or aluminum, or a material such as alumina, magnesium oxide or aluminum nitride, for example.

As illustrated in FIGS. 1, 2 and 5, each of the heat dissipaters 120a, 120b includes a plurality of fins 121 and a flange 122. Each of the heat dissipaters 120a, 120b is attached into an opening 131 of a frame 130, which will be described later. The heat dissipaters 120a, 120b are movable inside the openings 131 toward the memory 220 and the CPU 230, respectively. The heat dissipaters 120a, 120b are made of metal and the like with good thermal conductivity such as iron or aluminum. The heat dissipaters 120a, 120b are also called heatsinks.

As illustrated in FIGS. 1 to 5, the plurality of fins 121 are provided on the heat dissipaters 120a, 120b in such a manner that each fin 121 in the shape of a plate extends in the direction away from the top surface of the substrate 210.

As illustrated in FIGS. 1, 2 and 5, the flanges 122 are formed along the perimeter of the lower edge portion of each of the heat dissipaters 120a, 120b in such a manner that the flanges 122 protrude from the lower edge portion. Each flange 122 is provided in such a manner that the flange 122 faces an edge of the opening 131 of the frame 130 which will be described later. In this way, the heat dissipaters 120a, 120b can be provided so that the heat dissipaters 120a, 120b do not come out of the openings 131 in the frame 130 in the direction away from the substrate 210. Each flange 122 is formed in at least three locations in the lower edge portion of the heat dissipater 120a, 120b in such a manner that the flange 122 protrudes from the lower edge portion. When the opening 131, which will be described later, is rectangular, the flange 122 may be provided at least along opposite sides of the opening 131.

As illustrated in FIGS. 1 to 5, the frame 130 is formed into the shape of a plate. The frame 130 is attached above the top surface (the surface on the upper side of FIGS. 1 and 2) of the substrate 210 via a frame holding member 140. Accordingly, the frame 130 is disposed in the top surface side of the substrate 210 via the frame holding member 140. The frame 130 is made of a metal and the like with good thermal conductivity such as iron or aluminum.

As illustrated in FIGS. 1 and 2, the frame 130 has openings 131. The openings 131 are formed in locations in the frame 130 that correspond to the locations where the heat dissipaters 120a, 120b are provided. The heat dissipaters 120a, 120b pass through the openings 131. In other words, the heat dissipaters 120a, 120b are movable in the openings 131 toward the memories 220 and the CPUs 230.

As illustrated in FIGS. 1 and 2, the frame holding member 140 holds the frame 130 above the substrate 210. The frame holding member 140 is provided at the edge portions of the substrate 210. The frame holding member 140 is omitted from FIGS. 3 to 5 for convenience.

As illustrated in FIGS. 1, 2 and 5, each of the elastic rubber elements 150 is provided between the surface of the flange 122 that faces the opening 131 and the edge of the opening 131. The elastic rubber elements 150 are flexible (may also be elastic) and thermally conductive. Note that although "elastic" is included in the term, elastic rubber elements 150, the elastic rubber elements 150 need only to be at least flexible and do not necessarily need to be elastic. The elastic rubber elements 150 thermally couple the heat dissipaters 120a, 120b to the frame 130 and urge the heat dissipaters 120a, 120b toward the memories 220 or the CPUs 230. The elastic rubber elements 150 represent connecting elements and rubber elements in the present invention.

The elastic rubber element 150 is provided in accordance with the shape of the flange 122, for example. Specifically, when the flange 122 is formed in the shape of a ring along the perimeter of the lower edge portion of each of the heat dissipaters 120a, 120b in such a manner that the flange 122 protrudes from the lower edge portion, the elastic rubber element 150 is attached on the ring-shaped flanges 122. When the flanges 122 are formed at three locations in the lower edge portion of each of the heat dissipaters 120a, 120b in such a manner that the flanges 122 protrude from the lower edge portion, the elastic rubber elements 150 are attached on the flanges 122 in the three locations. If the opening 131 is rectangular and the flanges 122 are provided at least along opposite sides of the opening 131, the elastic rubber elements are attached to the two flanges 122 so that they face each other.

A configuration of the cooling device 100 has been described so far.

A method for attaching the cooling device 100 to an electronic circuit board 200 will be described next.

First, the electronic circuit board 200, the heat dissipaters 120a, 120b, the frame 130 and the frame holding member 140 are provided.

Then, as illustrated in FIG. 2, the heat dissipaters 120a, 120b are attached in the openings 131 in the frame 130 from the bottom surface (the surface on the lower side of FIG. 2) side of the frame 130. When attaching the heat dissipaters 120a, 120b, the elastic rubber elements 150 are interposed between the surface of the flanges 122 that faces the openings 131 and the edges of the openings 131. The heat dissipaters 120a, 120b, the frame 130 and the elastic rubber elements 150 assembled together are held above the substrate 210 via the frame holding member 140. The memory 220 and the heat dissipater 120a are disposed so that they face each other. The CPU 230 and heat dissipater 120b are disposed so that they face each other.

Then, the frame 130 is brought close to the substrate 210 so that the elastic rubber elements 150 are compressed as illustrated in FIG. 1. This causes the elastic rubber elements 150 to urge the heat dissipaters 120a, 120b toward the memory 220 and the CPU 230, respectively. As a result, the heat dissipater 120a is thermally coupled to the memory 220. Similarly, the heat dissipater 120b is thermally coupled to the CPU 230.

The elastic rubber elements 150 are thermally conductive and thermally couple the heat dissipaters 120a, 120b to the frame 130. Accordingly, heat generated by the memory 220 transfers into the frame 130 through the heat dissipater 120a and the elastic rubber elements 150. Similarly, heat generated by the CPU 220 transfers into the frame 130 through the heat dissipater 120b and the elastic rubber elements 150. Consequently, even when a heat generating component (the memory 220 or the CPU 230), for example, generates an amount of heat that exceeds the heat dissipation ability of the heat dissipater 120a, 120b thermally coupled to the heat generating component, heat generated by the heat generating component can be dissipated.

Note that when heat conducting sheets or heat dissipating grease is interposed between the thermal dissipaters 120a, 120b and the memory 220 and the CPU 230, the elastic rubber elements 150 urge the heat dissipaters 120a, 120b toward the memory 220 and the CPU 230, respectively, to compress the thermal conducting sheets or the heat dissipating grease to the maximum extent possible. This allows the heat dissipaters 120a, 120b to more reliably thermally couple to the memory 220 and the CPU 230. In particular, when there is a large distance (clearance) between a heat dissipater 120a, 120b and a memory 220 or CPU 230, it tends to reduce the heat resistance of heat dissipating grease, which can lead to an increase in the temperature of the memory 220 or CPU 230. In the cooling device 100, as described above, the elastic rubber elements 150 urge the heat dissipaters 120a, 120b toward the memory 220 and the CPU 230, respectively, to compress heat dissipating grease to the maximum extent possible. Accordingly, the distance between the heat dissipaters 120a, 120b and the memory 220 and the CPU 230 is reduced. This prevents a reduction in the heat resistance of the heat dissipating grease to prevent an increase in the temperatures of the memory 220 and the CPU 230.

As described above, the cooling device 100 according to the first exemplary embodiment of the present invention includes the heat dissipaters 120a, 120b, the frame 130, the openings 131, and the elastic rubber elements 150 (connecting elements). The heat dissipaters 120a, 120b are thermally coupled to a memory 220 and a CPU 230 (heat generating components) mounted on the top surface (the first surface) of the substrate. The frame 130 is thermally conductive. The frame 130 includes openings 131 in which the heat dissipaters 120a, 120b are disposed. Specifically, the openings 131 are formed in locations in the frame 130 that correspond to the locations where the heat dissipaters 120a, 120b are provided. The elastic rubber elements 150 are thermally conducive and flexible. The elastic rubber elements 150 thermally couple the heat dissipaters 120a, 120b to the frame 130.

The frame 130 is thermally conductive and is disposed in the top surface side of the substrate 210 as described above. The thermally conductive and flexible elastic rubber elements 150 urge the heat dissipaters 120a, 120b toward the memory 220 and the CPU 230, respectively. This thermally couples the heat dissipater 120a to the memory 220. Similarly, the heat dissipater 120b is thermally coupled to the CPU 230. The elastic rubber elements 150 are thermally conductive and thermally couple the heat dissipaters 120a, 120b to the frame 130. This causes heat generated by the memory 220 to transfer into the frame 130 through the heat dissipater 120a and the elastic rubbers 150. Similarly, heat generated by the CPU 220 transfers into the frame 130 through the heat dissipater 120b and the elastic rubbers 150. Consequently, the cooling device 100 is capable of dissipating heat generated by a heat generating component (the memory 220 or the CPU 230), for example, even when the heat generating component generates an amount of heat that exceeds the heat dissipation ability of the heat dissipater 120a, 120b thermally coupled to the heat generating component.

Further, the cooling device 100 according to the first exemplary embodiment of the present invention includes flanges 122. The flanges 122 are formed in the edge portion of the heat dissipater 120a, 120b in such a manner that each of the flanges 122 faces an edge of an opening 131 and protrudes from the edge portion. The elastic rubber elements 150 (the connecting elements) are interposed between the surface of each flange 122 that faces each opening 131 and the edges of the opening 131.

In this way, the flanges 122 are formed in the edge portions of the heat dissipaters 120a, 120b in such a manner that the flanges 122 protrude from the edge portions and the elastic rubber elements 150 are interposed between the surface of each flange 122 that faces each opening 131 and the edge of the opening 131. Thus, connecting elements that have both of the thermal coupling function and the urging function can be compactly and readily provided.

If the openings 131 in the cooling device 100 according to the first exemplary embodiment of the present invention are rectangular, the flanges 122 are provided at least along opposite sides of each of the openings 131. This allows the connecting elements that have both of the thermal coupling function and the urging function to be arranged in a balanced manner. This means that the heat dissipaters 120a, 120b can be kept in parallel with the top surface of the substrate 210 and the heat dissipaters 120a, 120b can be prevented from being significantly tilted with respect to the top surface of the substrate 210. In addition, heat generated by the memory 220 and the CPU 230 can be uniformly transferred to the heat dissipaters 120a, 120b.

The connecting elements (the elastic rubber elements 150) in the cooling device 100 according to the first exemplary embodiment of the present invention are rubber members. Thus, the connecting elements can be configured by simple members.

In the cooling device 100 according to the first exemplary embodiment of the present invention, each of a plurality of heat dissipaters 120a, 120b thermally couples to one of a plurality of heat generating components (the memories 220 and CPUs 230) mounted on the substrate 210. A plurality of openings 131 are provided in locations corresponding to the locations where the plurality of heat dissipaters 120a, 120b are provided. A plurality of elastic rubber elements 150

(connecting elements) are provided for each of the plurality of heat dissipaters 120a, 120b. The plurality of elastic rubber elements 150 thermally couple the plurality of heat dissipaters 120a, 120b to the frame 130 and urge each of the plurality of heat dissipaters 120a, 120b toward each of the plurality of heat generating components (memories 220 and the CPUs 230).

In this way, for a substrate 210 on which a plurality of heat generating components are mounted, a plurality of openings 131 are formed in a frame 130, a plurality of heat dissipaters 120a, 120b are movably attached in the plurality of openings 131, and each of the plurality of heat dissipaters 120 are urged by connecting elements toward each of the plurality of heat generating components. This simple configuration can transfer heat generated by a plurality of heat generating components into the frame 130 at the same time.

A device according to the first exemplary embodiment of the present invention includes a memory 220, a CPU 230 (heat generating components), heat dissipaters 120a, 120b, a frame 130, openings 131, and elastic rubber elements 150 (connecting elements). The memory 220 and the CPU 230 are mounted on a top surface (a first surface) of a substrate 210. The heat dissipaters 120a, 120b are thermally coupled to the memory 220 and the CPU 230. The frame 130 is thermally conductive and is disposed above the top surface of the substrate 210. The openings 131 are formed in locations in the frame 130 that correspond to the locations where the heat dissipaters 120a, 120b are provided. The elastic rubber elements 150 are thermally conductive and flexible. The elastic rubber elements 150 thermally couple the heat dissipaters 120a, 120b to the frame 130. This configuration also has the same advantageous effects as the cooling device 100 described above.

Second Exemplary Embodiment

Figure 6:
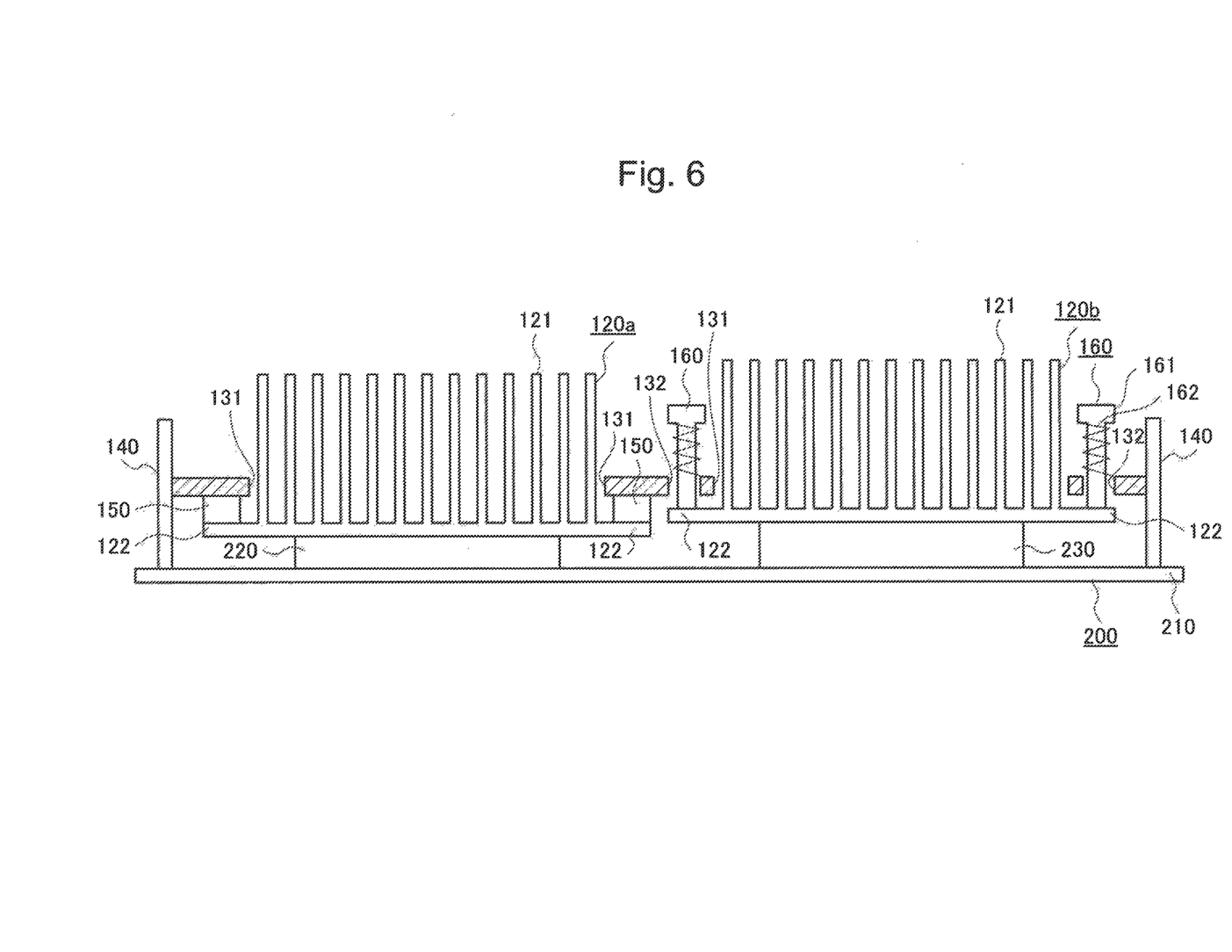
FIG. 6 is a cross-sectional view of a cooling device according to a second exemplary embodiment of the present invention after being attached to an electronic circuit board.
Figure 7:
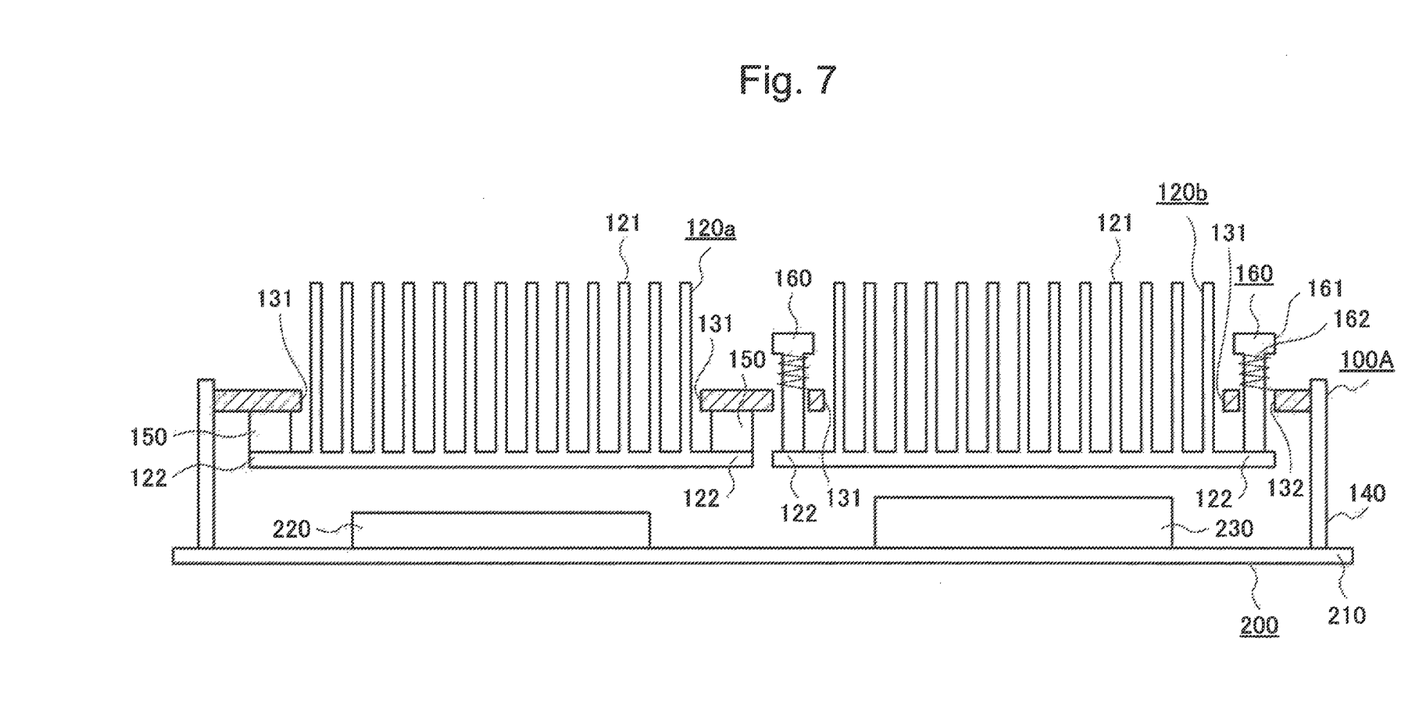
FIG. 7 is a cross-sectional view of the cooling device according to the second exemplary embodiment before being attached to the electronic circuit board.

A configuration of a cooling device 100A according to a second exemplary embodiment of the present invention will be described next. FIG. 6 is a cross-sectional view of the cooling device 100A after being attached to an electronic circuit board 200. FIG. 7 is a cross-sectional view of the cooling device 100A before being attached to the electronic circuit board 200. FIG. 6 corresponds to FIG. 1 and FIG. 7 corresponds to FIG. 2. In FIGS. 6 and 7, components that are equivalent to components illustrated in FIGS. 1 to 5 are given the same reference numerals as those in FIGS. 1 to 5.

As illustrated in FIGS. 6 and 7, the cooling device 100A includes heat dissipaters 120a, 120b, a frame 130, a frame holding member 140, and spring screws 160.

FIGS. 1 and 2 are compared with FIGS. 6 and 7. In FIGS. 1 and 2, the elastic rubber elements 150 are provided between the frame 130 and the flanges 122 as connecting elements. In FIGS. 6 and 7, on the other hand, the spring screws 160 are attached to the edge portions of openings 131 in the frame 130 and to the flanges 122. This is the difference between the two exemplary embodiments.

As illustrated in FIGS. 6 and 7, each of the spring screws 160 includes a screw 161 and a helical spring 162. The spring screws 160 represent connecting elements and spring members in the present invention.

The screws 161 are attached to the flanges 122 through screw holes 132 formed in the frame 130. The screws 161 are made of a thermally conductive material such as stainless steel.

The helical spring 162 is provided between the head of the screw 161 and a top surface of the frame 130 (the upper side of FIGS. 6 and 7). The helical spring 162 is thermally conducive. The helical spring 162 is compressed as the screw 161 is pushed against the flange 122. This causes the screw 161 and the helical spring 162 to thermally couple the heat dissipater 120b to the frame 130. The helical spring 162 also urges the heat dissipater 120b toward a CPU 230. The helical spring 162 is made of a thermally conductive material such as phosphor bronze. Note that while helical springs 162 are used in this exemplary embodiment, spring washers may be used in place of the helical springs 162.

A configuration of the cooling device 100A has been described so far.

A method for attaching the cooling device 100A to an electronic circuit board 200 will be described next.

First, the electronic circuit board 200, the heat dissipaters 120a, 120b, the frame 130 and the frame holding member 140 are provided.

Then, the heat dissipaters 120a, 120b are attached into the openings 131 in the frame 130 as illustrated in FIG. 7.

At this stage, the elastic rubber elements 150 are interposed between the surface of the flanges 122 that faces the openings 131 and the edges of the openings 131.

The heat dissipaters 120a, 120b, the frame 130 and the elastic rubber elements 150 assembled together are held above the substrate 210 via the frame holding member 140.

The memory 220 and the heat dissipater 120a are disposed so that they face each other. The CPU 230 and heat dissipater 120b are disposed so they face each other.

Then, the frame 130 is brought close to the substrate 210 so that the elastic rubber elements 150 are compressed as illustrated in FIG. 6. This causes the elastic rubber elements 150 to urge the heat dissipater 120a toward the memory 220. As a result, the heat dissipater 120a is thermally coupled to the memory 220.

The elastic rubber elements 150 are thermally conductive and thermally couple the heat dissipater 120a to the frame 130. Accordingly, heat generated by the memory 220 transfers into the frame 130 through the heat dissipater 120a and the elastic rubber elements 150. Consequently, even when a heat generating component (the memory 220), for example, generates an amount of heat that exceeds the heat dissipation ability of the heat dissipater 120a thermally coupled to the heat generating component, heat generated by the heat generating component can be dissipated.

Then, the screws 161 of the spring screws 160 are attached to the flange 122 of the heat dissipater 120b thorough screw holes 132 as illustrated in FIG. 6. The helical springs 162 are compressed as the screws 161 are pushed against the flange 122. This causes the screws 161 and the helical springs 162 to thermally couple the heat dissipater 120b to the frame 130. The helical springs 162 urge the heat dissipater 120b toward a CPU 230. This causes the heat dissipater 120b to thermally couple to the CPU 230.

The screws 161 and the helical springs 162 are thermally conductive and thermally couple the heat dissipater 120b to the frame 130. This allows heat generated by the CPU 230 to transfer into the frame 130 through the heat dissipater 120b, the screw 161 and the helical spring 162. Consequently, even when the heat generating component (the CPU 230) generates a heat that exceeds the heat dissipation ability of the heat dissipater 120b thermally coupled to the heat generating component, heat generated by the heat generating component can be dissipated.

As described above, the cooling device 100A according to the second exemplary embodiment is configured with helical springs 162 (spring members) as connecting elements. The cooling device 100A according to the second exemplary embodiment therefore has the same advantageous effects as the advantageous effects described in the first exemplary embodiment.

When a heat generating component is a CPU 230, the connecting elements in the cooling device 100A according to the second exemplary embodiment of the present invention are spring screws 160 (spring members); when a heat generating component is a memory (a storage device), the connecting elements in the cooling device 100A are elastic rubber elements 150 (rubber members).

In this way, if a heat generating component is a CPU 230, the heat dissipater 120*b* can be urged toward the CPU 230 by using the helical springs 162 of the spring screws 160 with a lager urging force than elastic rubber elements 150. This can more reliably thermally couple the heat dissipater 120*b* to the CPU 230.

Generally, the area of contact of an elastic rubber element 150 with the heat dissipater 120*a* and the frame 130 is smaller than the area of contact of a spring 161 and a helical spring 162 with the heat dissipater 120*b* and the frame 130. Accordingly, transfer of heat of the memory 220 transferred to the frame 130 from the frame 130 to the heat dissipater 120*b* through the screw 161 and the helical spring 162 is minimized.

On the other hand, heat of the CPU 230 transferred into the heat dissipater 120*b* does not easily transfer into the frame 130 through the screw 161 and the helical spring 162. In this way, the use of the spring screws 160 as connecting elements can thermally insulate a given heat dissipater 120*b* from the frame 130 connected to another heat dissipater 120*a*.

More preferably, the screws 161 and the helical springs 162 are made of resin, which has low thermal conductivity. In this case, the screws 161 and the helical springs 162 less easily transfer heat of the CPU 230 transferred to the heat dissipater 120*b* to the frame 130. In this way, a given heat dissipater 120*b* can be more reliably thermally insulated from the frame 130 connected to another heat dissipater 120*a*.

The present invention has been described with respect to exemplary embodiments thereof. The exemplary embodiments are merely illustrative and various changes, additions, omissions or combinations may be made to the exemplary embodiments described above without departing from the gist of the present invention. It will be understood by those skilled in the art that variations resulting from such changes, additions, omissions, or combinations also fall within the scope of the present invention.

REFERENCE SIGNS LIST 100, 100A Cooling device
120*a*, 120*b* Heat dissipater
121 Fin
122 Flange
130 Frame
140 Frame holding member
150 Elastic rubber element
160 Spring screw
161 Screw
162 Helical spring
200 Electronic circuit board
210 Substrate
220 Memory
230 CPU The previous description of embodiments is provided to enable a person skilled in the art to make and use the present invention. Moreover, various modifications to these exemplary embodiments will be readily apparent to those skilled in the art, and the generic principles and specific examples defined herein may be applied to other embodiments without the use of inventive faculty. Therefore, the present invention is not intended to be limited to the exemplary embodiments described herein but is to be accorded the widest scope as defined by the limitations of the claims and equivalents.

Further, it is noted that the inventor's intent is to retain all equivalents of the claimed invention even if the claims are amended during prosecution.

What is claimed is:

1. A cooling device for at least one heat generating component mounted on a first surface of a substrate, comprising:
   a plurality of heat dissipaters thermally coupled to the heat generating component;
   a frame which is thermally conductive and includes a plurality of openings in which the plurality of heat dissipaters are disposed; and
   a connecting element which is thermally conductive and flexible and thermally couples each of the plurality of heat dissipaters to the frame.

2. The cooling device according to claim 1, further comprising a flange formed in an edge portion of at least one of the heat dissipaters in such a manner that the flange faces an edge of the at least one of the openings and protrudes from the edge portion of the at least one of the heat dissipaters,
   wherein the connecting element is provided between a surface of the flange and the edge of the at least one of the openings, the surface facing the at least one of the openings.

3. The cooling device according to claim 2,
   wherein when at least one of the openings is rectangular, the flange is provided at least along opposite sides of the at least one of the openings.

4. The cooling device according to of claim 1, wherein the connecting element includes a spring member or a rubber member.

5. The cooling device according to claim 1,
   wherein each of the heat dissipaters thermally couples to each of a plurality of heat generating components, including the heat generating component, mounted on the substrate;
   the plurality of openings are provided in locations corresponding to locations where the plurality of heat dissipaters are disposed; and
   a plurality of connecting elements, including the connecting element, are provided to each of the plurality of heat dissipaters, thermally couple the plurality of heat dissipaters to the frame, and urge each of the plurality of heat dissipaters toward each of the plurality of heat generating components.

6. The cooling device according to claim 5,
   wherein in a case in which the heat generating components are central processing units, the connecting elements are spring members; and
   in a case in which the heat generating components are storage devices, the connecting elements are rubber members.

7. The cooling device according to claim 1, wherein the connecting element comprises rubber.

8. A device, comprising:
   a substrate having a first surface;
   a plurality of heat generating components mounted on the first surface of the substrate;

a plurality of heat dissipaters thermally coupled to the heat generating components;
a frame which is thermally conductive and includes a plurality of openings in which the plurality of heat dissipaters are disposed; and
a connecting element which is thermally conductive and flexible and thermally couples each of the plurality of heat dissipaters to the frame.

9. The cooling device according to claim 8, wherein the connecting element thermally couples the plurality of heat dissipaters through the plurality of openings.

* * * * *